United States Patent [19]

Nishimura et al.

[11] Patent Number: 5,703,814
[45] Date of Patent: Dec. 30, 1997

[54] SEMICONDUCTOR MEMORY DEVICE HAVING DUAL BOOSTING CIRCUITS TO REDUCE ENERGY REQUIRED TO SUPPLY BOOSTING VOLTAGES

[75] Inventors: Koichi Nishimura; Masato Matsumiya, both of Kawasaki, Japan

[73] Assignee: Fujitsu Limited, Kawasaki, Japan

[21] Appl. No.: 680,961

[22] Filed: Jul. 16, 1996

[30] Foreign Application Priority Data

Jul. 19, 1995 [JP] Japan .................. 7-182720

[51] Int. Cl.[6] ................................. G11C 13/00
[52] U.S. Cl. ............... 365/189.09; 365/149; 365/189.11; 365/203
[58] Field of Search .......................... 365/149, 226, 365/227, 189.11, 189.09, 203; 327/534, 536

[56] References Cited

U.S. PATENT DOCUMENTS

| | | | |
|---|---|---|---|
| 5,272,393 | 12/1993 | Horiguchi et al. | 307/296.6 |
| 5,420,823 | 5/1995 | Yonaga et al. | 365/226 |
| 5,426,333 | 6/1995 | Maeda | 327/536 |
| 5,446,697 | 8/1995 | Yoo et al. | 365/226 |
| 5,448,198 | 9/1995 | Toyoshima et al. | 327/530 |

*Primary Examiner*—David C. Nelms
*Assistant Examiner*—Hien Nguyen

[57] ABSTRACT

A semiconductor memory device includes pairs of bit lines, first circuits which are respectively coupled to the pairs of bit lines and precharge the pairs of bit lines in accordance with a first control signal, sense amplifiers respectively coupled to the pairs of bit lines, and second circuits which are respectively provided between the pairs of bit lines and the sense amplifiers and selectively connect the pairs of bit line to the sense amplifiers in response to a second control signal. A third circuit produces first and second boosted voltages from a power supply voltage and supplies the first and second boosted voltages to the first and second circuits respectively. The first control signal is produced from the first boosted voltage and the second control signal is produced from the second boosted voltage. The first boosted voltage being lower than the second boosted voltage.

19 Claims, 7 Drawing Sheets

5,703,814

1

SEMICONDUCTOR MEMORY DEVICE HAVING DUAL BOOSTING CIRCUITS TO REDUCE ENERGY REQUIRED TO SUPPLY BOOSTING VOLTAGES

BACKGROUND OF THE INVENTION

1. Field of the Invention

The present invention generally relates to semiconductor memory devices, and more particularly to a semiconductor memory device equipped with a voltage boost circuit which derives a boosted voltage from a power supply voltage or the like.

2. Description of the Related Art

A dynamic random access memory (DRAM) device is known as a semiconductor memory device as described above. The DRAM device is used for a personal computer of a notebook type or the like driven by a battery, and is hence required to consume a small amount of energy.

FIG. 1 is a block diagram of a related part of a conventional DRAM device. In FIG. 1, there are illustrated word lines $WL_0$ and $WL_N$ for selecting memory cells, and bit lines BL and $\overline{BL}$ serving as data transfer paths. There are also illustrated memory cells $1_0$ and $1_n$, and capacitors $2_0$ and $2_n$ for storing charges (so-called cell capacitors). Furthermore, there are illustrated nMOS transistors $3_0$ and $3_n$ for controlling inputting and outputting charges (so-called cell transistors). A symbol VP denotes a cell plate voltage.

The DRAM device shown in FIG. 1 includes a bit line resetting/short-circuiting circuit 4, which resets the bit lines BL and $\overline{BL}$ to a precharge voltage VPR (=VCC/2). The circuit 4 includes nMOS transistors 5, 6 and 7, which are turned ON and OFF in response to a bit line resetting/short-circuiting control signal BRS. A sense amplifier 8 is connected between the bit lines BL and $\overline{BL}$ via a bit line transfer circuit 9. The sense amplifier 8 amplifies data read from the selected memory cell. The bit line transfer circuit 9 connects the bit lines BL and $\overline{BL}$ to the sense amplifier 8. The bit line transfer circuit 9 includes nMOS transistors 10 and 11, which are turned ON and OFF by a bit line transfer control signal BLT generated by a bit line transfer control signal generating circuit (BLT generating circuit) 15.

A voltage boost circuit 12 has a charge pump, which steps up the power supply voltage VCC and thus results in a boosted voltage SVCC (=VCC+VTH+α) where VTH is the threshold voltage of the nMOS transistors, and α denotes a margin voltage. A row decoder 13 selects from the word lines $WL_0$–$WL_n$ and drives the selected word line. The row decoder 13 is supplied with the boosted voltage SVCC from the boost circuit 12, and supplies the selected word line with the boosted voltage SVCC. The row decoder 13 sets the non-selected word lines to the ground voltage VSS.

A bit line resetting/short-circuiting control signal generating circuit (BRS generating circuit) 14 generates the bit line resetting/short-circuiting control signal BRS, which has a high level (H level) equal to the boosted voltage SVCC and a low level (L level) equal to the ground voltage VSS.

When the bit line resetting/short-circuiting control signal BRS is set to the high level in the bit line resetting/short-circuiting circuit 4, the nMOS transistors 5–7 are turned ON, and thus the bit lines BL and $\overline{BL}$ are reset to the precharge voltage VPR. When the bit line resetting/short-circuiting control signal BRS is set to the low level, the nMOS transistors 5–7 are turned OFF, and thus the bit lines BL and $\overline{BL}$ are prevented from being supplied with the precharge voltage VPR.

2

The bit line transfer control signal generating circuit (BLT generating circuit) 15 is supplied with the boosted voltage SVCC from the boost circuit 12, and derives therefrom the bit line transfer control signal BLT, which has a high level (H level) equal to the boosted voltage SVCC and a low level (L level) equal to the ground voltage VSS.

When the bit line transfer control signal BLT is set to the high level in the bit line transfer circuit 9, the nMOS transistors 10 and 11 are turned ON, and thus the bit lines BL and $\overline{BL}$ are connected to the sense amplifier 8. When the bit line transfer control signal BLT is set to the low level, the nMOS transistors 10 and 11 are turned OFF, and the bit lines BL and $\overline{BL}$ are disconnected from the sense amplifier 8.

In the above-mentioned DRAM device, it is necessary for the word line driving voltage and the high-level voltage of the bit line transfer control signal BLT to be equal to the boosted voltage SVCC (=to VCC+VTH and α). However, the high-level voltage of the bit line resetting/short-circuiting control signal BRS is sufficient to be equal to VCC/2+VTH+α in order to precharge the bit lines BL and $\overline{BL}$ to the precharge voltage VPR (=VCC/2).

However, in the DRAM device shown in FIG. 1, the high-level voltage of the bit line resetting/short-circuiting control signal BRS is set equal to the boosted voltage SVCC (=VCC+VTH+α), which is supplied to the BRS generating circuit 14 from the boost circuit 12.

The boost circuit 12 which generates the boosted voltage SVCC equal to VCC+VTH+α needs a larger number of boost stages than that necessary to generate the other boosted voltage equal to VCC/2+VTH+α. However, this configuration does not have a good efficiency and consumes a large amount of current. In other words, in the conventional DRAM device, the high-level voltage of the bit line resetting/short-circuiting control signal BRS is set equal to VCC+VTH+α although it is sufficient to be equal to VCC/2+VTH+α. Hence, the boost circuit 12 consumes current greater than that necessary to generate the boosted voltage VCC/2+VTH+α and thus consumes a large amount of energy.

SUMMARY OF THE INVENTION

It is a general object of the present invention to provide a semiconductor memory device in which the above disadvantages are eliminated.

A more specific object of the present invention is to provide a semiconductor memory device equipped with a boost circuit which consumes a smaller amount of current so that the semiconductor memory device consumes a smaller amount of energy.

The above objects of the present invention are achieved by a semiconductor memory device comprising: pairs of bit lines; first circuits which are respectively coupled to the pairs of bit lines and precharge the pairs of bit lines in accordance with a first control signal; sense amplifiers respectively coupled to the pairs of bit lines; second circuits which are respectively provided between the pairs of bit lines and the sense amplifiers and selectively connect the pairs of bit lines to the sense amplifiers in response to a second control signal; and a third circuit which produces first and second boosted voltages from a power supply voltage and supplies the first and second boosted voltages to the first and second circuits respectively, wherein the first control signal is produced from the first boosted voltage and the second control signal is produced from the second boosted voltage. The first boosted voltage is lower than the second boosted voltage.

The third circuit may comprise a first circuit section which derives the first boosted voltage from the power supply voltage, and a second circuit section which derives the second boosted voltage from the power supply voltage.

The above first circuit section may comprise: a first switch element having a first end receiving the power supply voltage, and a second end; a second switch element having a first end connected to the second end of the first switch element and a second end via which the first boosted voltage is output; and a capacitor having a first end connected to the second end of the first switch element and a second end receiving a driving signal.

The above second circuit section may comprise: a first switch element having a first end receiving the power supply voltage and a second end; a second switch element having a first end connected to the second end of the first switch element and a second end; a third switch element having a first end connected to the second end of the second switch element and a second end via which the second boosted voltage is output; a first capacitor having a first end connected to the second end of the first switch element and a second end receiving a first driving signal; and a second capacitor having a first end connected to the second end of the second switch element and a second end receiving a second driving signal having a complementary relationship with the first driving signal.

The first driving signal may be the same as the second driving signal.

The semiconductor memory device may further comprise an oscillation circuit generating the second and third driving signals.

The first driving signal may be based on a row address strobe signal externally applied to the semiconductor memory device.

The above-mentioned objects of the present invention are also achieved by a semiconductor memory device comprising a boost circuit which produces boosted voltages from a power supply voltage, the boosted voltages having different voltage values.

The above boosted voltages may include a first boosted voltage to be supplied to word lines for selecting memory cells and circuits which connect bit lines serving as data transfer paths to sense amplifiers, and a second boosted voltage to be supplied to a circuit which precharges the bit lines. The second boosted voltage is lower than the first boosted voltage.

The boost circuit may comprise a plurality of boost circuits. In this case, the plurality of boost circuits may include a first boost circuit which produces a first boosted voltage to be supplied to word lines for selecting memory cells and circuits which connect bit lines serving as data transfer paths to sense amplifiers, and a second boost circuit which produces a second boosted voltage to be supplied to a circuit which precharges the bit lines. The second boosted voltage is lower than the first boosted voltage.

The above first boost circuit may comprise: a first switch element having a first end supplied to the power supply voltage, and a second end; a second switch element having a first end connected to the second end of the first switch element, and a second end; a third switch element having a first end connected to the second end of the second switch element, and a second end via which the first boosted voltage is output; a first capacitor having a first end connected between the first and second switch elements, and a second end supplied with a first driving signal; and a second capacitor having a first end connected between the second and third switch elements, and a second end supplied with a second driving signal which corresponds to an inverted version of the first driving signal. The second boost circuit may comprise: a fourth switch element having a first end supplied with the power supply voltage, and a second end; a fifth switch element having a first end connected to the second end of the fourth switch element, and a second end via which the second boosted voltage is output; and a third capacitor having a first end connected between the fourth and fifth switch elements, and a second end supplied with a third driving signal.

The first and second driving signals may be signals generated in the semiconductor memory device; and the third driving signal may be based on a row address strobe signal supplied from an outside of the semiconductor memory device.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
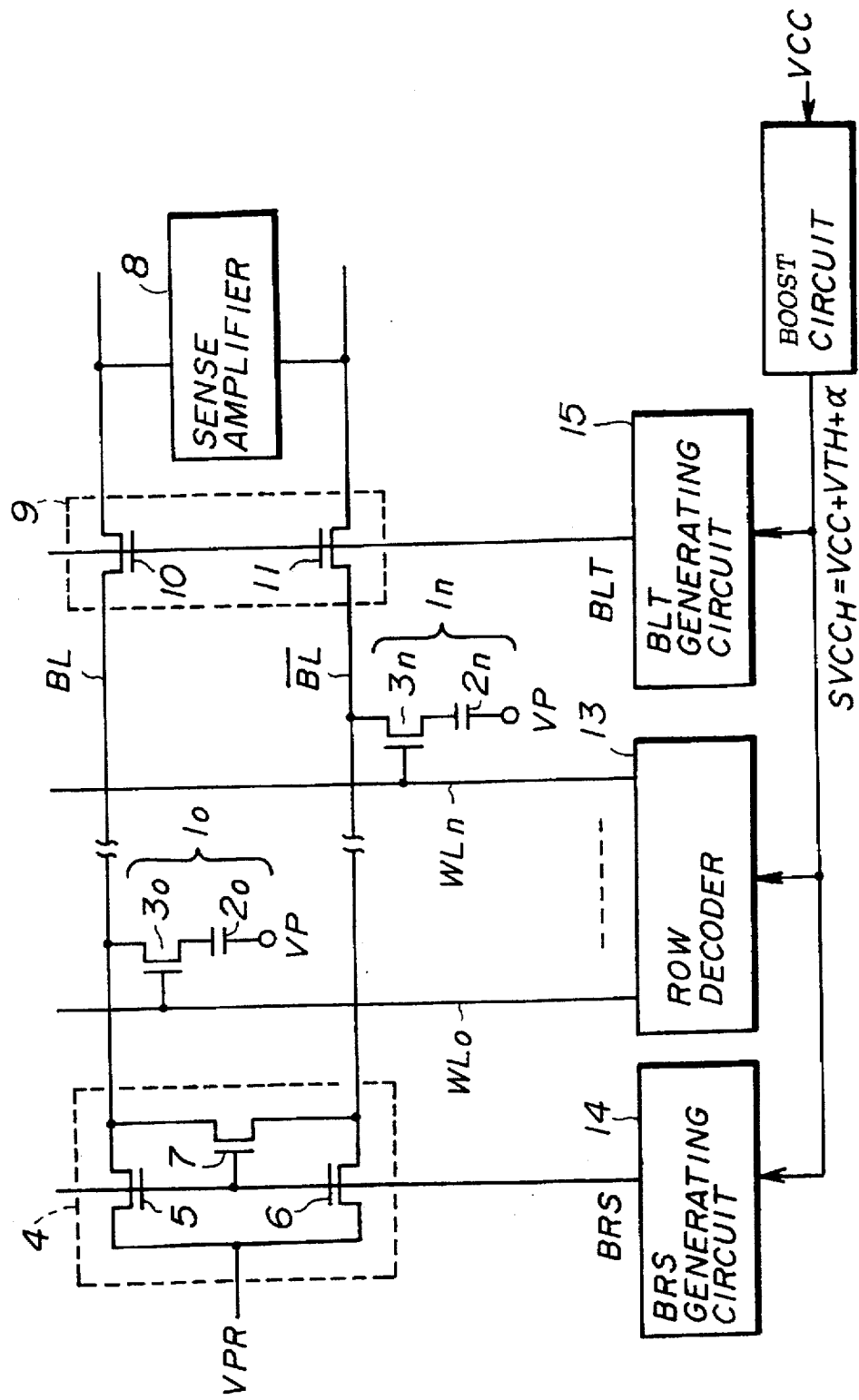
FIG. 1 is a block diagram of a related part of a conventional DRAM device.
Figure 2:
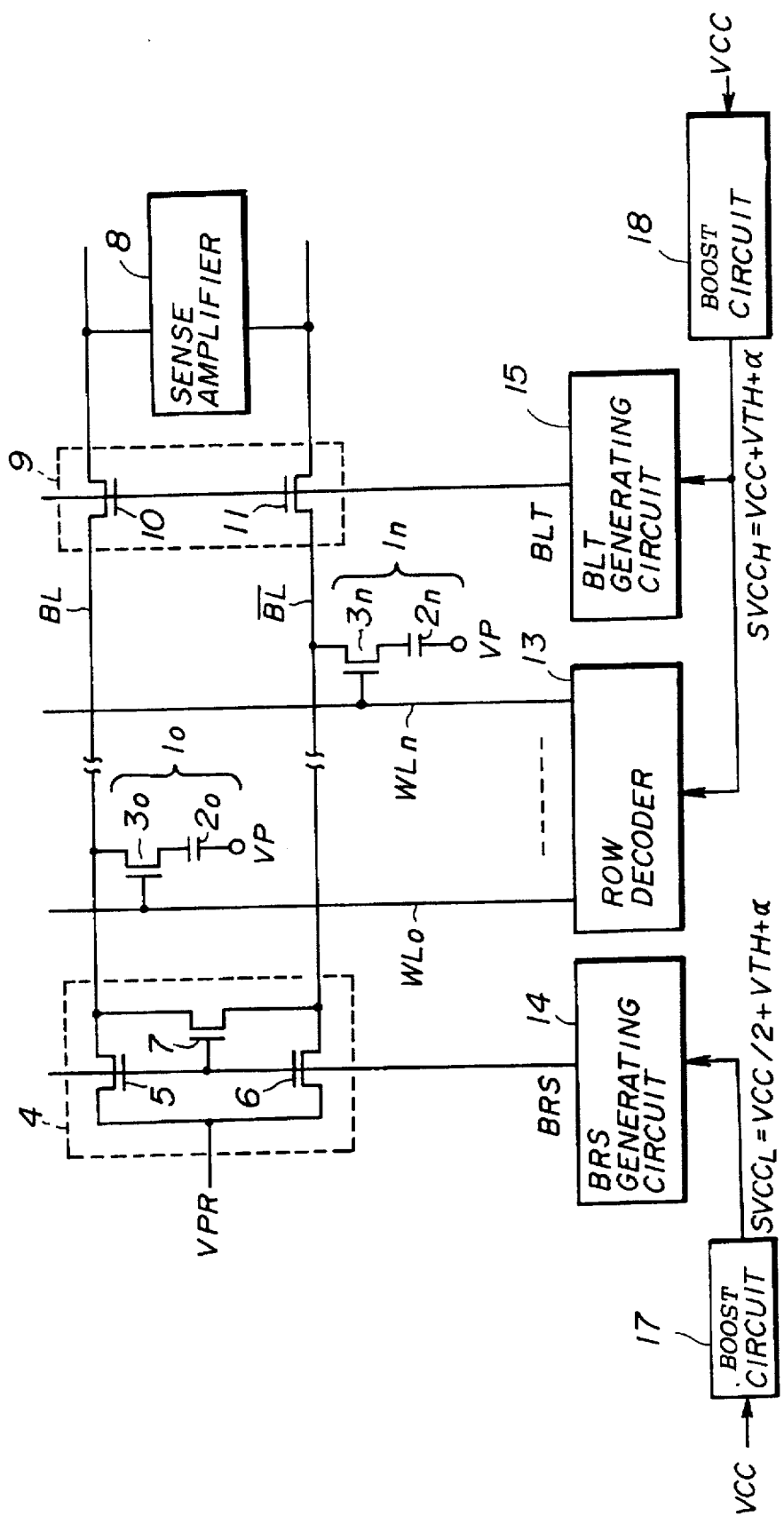
FIG. 2 is a block diagram of an essential part of a DRAM device according to an embodiment of the present invention.

FIG. 2 is a block diagram of a DRAM device according to an embodiment of the present invention. In FIG. 2, parts that are the same as those shown in FIG. 1 are given the same reference numbers. Instead of the boost circuit 12 shown in FIG. 1, two voltage boost circuits 17 and 18 are used in the configuration shown in FIG. 2.

The bit line resetting/short-circuiting circuits 4, the bit line transfer circuits 9 and the sense amplifiers 8 are provided to respective pairs of bit lines.

The boost circuit 17 steps up the power supply voltage VCC and thus generates a boosted voltage $SVCC_L$ equal to $VCC/2+VTH+\alpha$, which is then supplied to the BRS generating circuit 14. The boost circuit 18 steps up the power supply voltage VCC and thus generates a boosted voltage $SVCC_H$ equal to $VCC+VTH+\alpha$, which is then supplied to the row decoder 13 and the BLT generating circuit 15.

Figure 3A:
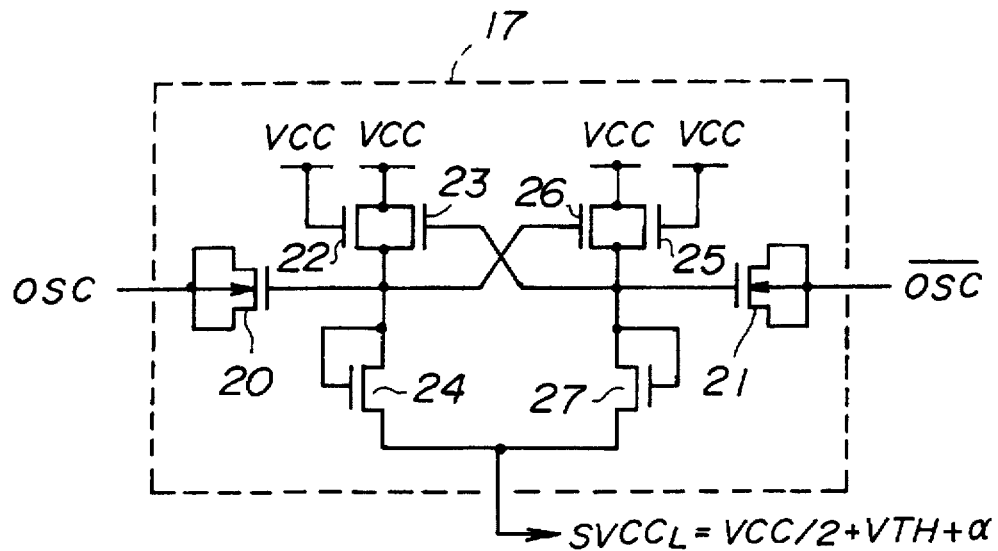
FIG. 3A is a circuit diagram of a boost circuit 17 shown in FIG. 2.

FIG. 3A is a circuit diagram of the boost circuit 17, which is supplied with complementary oscillation signals (driving signals) OSC and $\overline{OSC}$ generated by an oscillation circuit provided in the DRAM device. The boost circuit 17 includes MOS capacitors 20 and 21 and nMOS transistors 22–27. These structural components are connected as shown in FIG. 3A.

Figure 4:
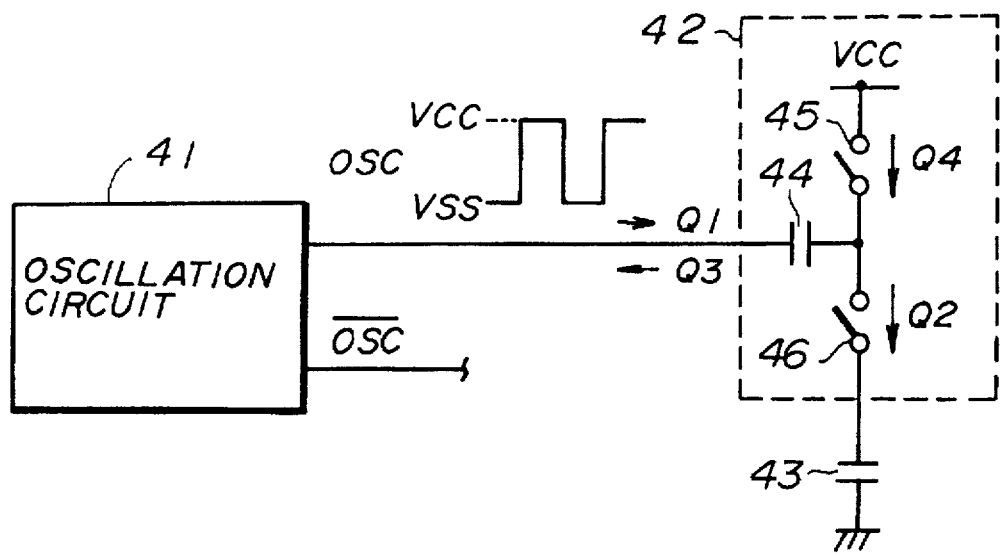
FIG. 4 is a modeled circuit diagram for explaining an operation of the boost circuit 17 shown in FIG. 3A.

FIG. 4 is a circuit diagram showing an operation of the boost circuit 17. An oscillation circuit 41 generates the oscillation signals OSC and $\overline{OSC}$. A circuit 42 is obtained by modeling the circuit part including the MOS capacitor 20 and the nMOS transistors 22–24 of the boost circuit 17. A load capacitance 43 of the boost circuit 17 is connected to the modeled circuit 42. The modeled circuit 42 shown in FIG. 4 has the capacitor 44, and switches 45 and 46. The capacitor 44 corresponds to the MOS capacitor 20, and the switch 45 corresponds to the nMOS transistors 22 and 23. The switch 46 corresponds to the nMOS transistor 24.

A state will be assumed in which the switches 45 and 46 are ON and OFF, respectively, and the oscillation signal OSC is at the ground voltage VSS. From the above state, the switches 45 and 46 are respectively turned OFF and ON, and the oscillation signal OSC is switched to the power supply voltage VCC. Then, the voltage of the oscillation signal OSC is increased from the ground voltage VSS to the power supply voltage VCC. During this time, a charge Q1 is supplied from the oscillation circuit 41 to the capacitor 44, and a charge Q2 of the same amount as the charge Q1 is supplied from the capacitor 44 to the load capacitance 43 via the switch 46.

When the switches 45 and 46 are respectively turned ON and OFF, the oscillation signal OSC switches to the ground voltage VSS. When the oscillation signal OSC is decreased from the power supply voltage VCC to the ground voltage VSS, a charge Q3 having the same amount as the charge Q1 is drawn from the capacitor 44 to the oscillation circuit 41, and a charge Q4 of the same amount as the charge Q3 is supplied from the VCC power supply to the capacitor 44 via the switch 45. Then, the same operation as described above is repeatedly carried out.

Hence, the maximum efficiency $\Gamma$ of the modeled circuit 42 corresponding to the circuit part including the MOS capacitor 20 and the nMOS transistors 22–24, that is, the maximum efficiency $\Gamma$ of the boost circuit 17 is as follows:

$$\Gamma = [(\text{current supplied to the load capacitance 43})/(\text{current consumed in circuit 42})] \times 100$$
$$= [Q2/(Q1+Q4)] \times 100.$$

since Q1=Q2=Q4, the maximum efficiency $\Gamma$ of the boost circuit 17 is equal to (½)×100=50[%].

Figure 3B:
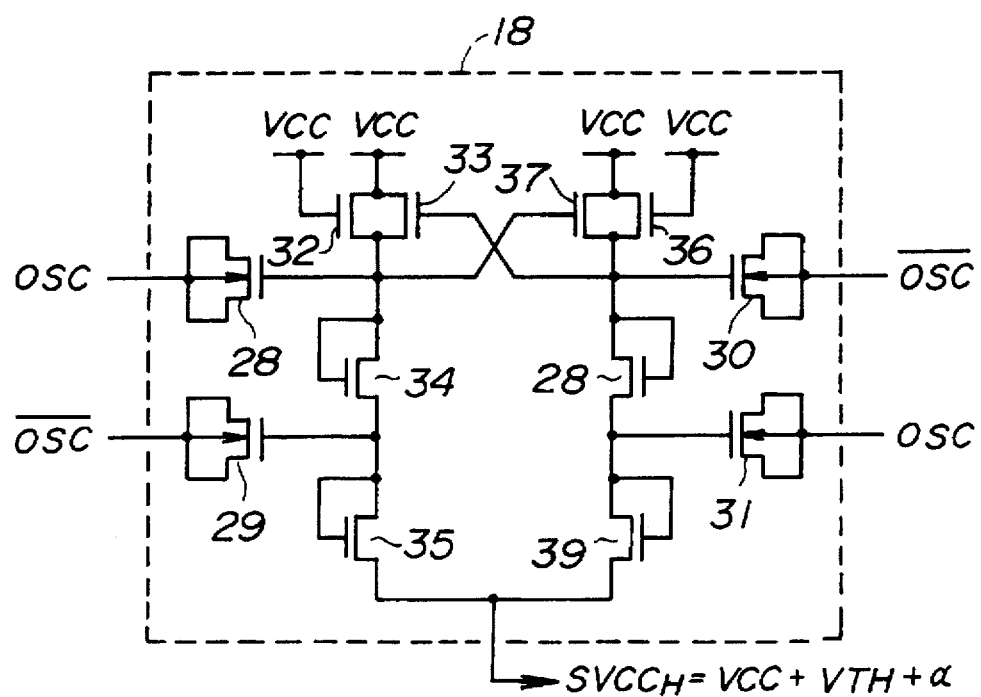
FIG. 3B is a circuit diagram of a boost circuit 18 shown in FIG. 2.

FIG. 3B is a circuit diagram of the boost circuit 18. As shown in FIG. 3B, the boost circuit 18 includes MOS capacitors 28–31 and nMOS transistors 32–39. These components are connected, as shown in FIG. 3B.

Figure 5:
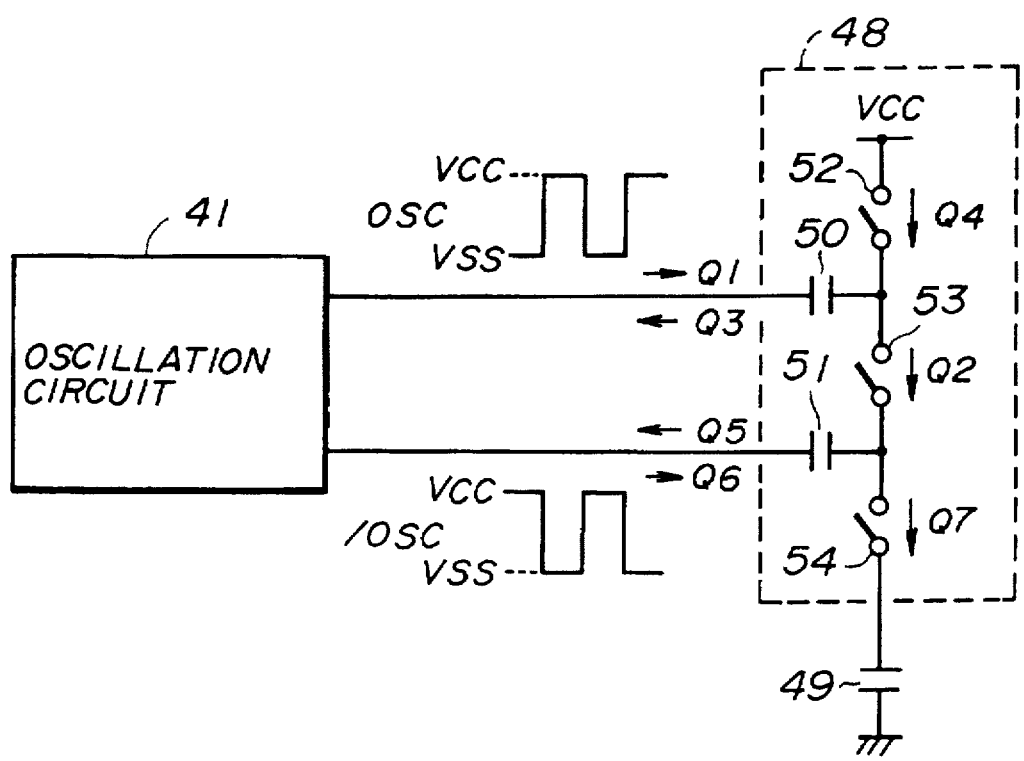
FIG. 5 is a modeled circuit diagram for explaining an operation of the boost circuit 18 shown in FIG. 3B.

FIG. 5 is a circuit diagram showing an operation of the boost circuit 18. More particularly, FIG. 5 shows a modeled circuit 48 obtained by modeling a circuit part including the MOS capacitors 28 and 29 and the nMOS transistors 32–35 of the boost circuit 18. A load capacitance 49 of the boost circuit 18 is connected to the modeled circuit 48. The modeled circuit 48 includes capacitors 50 and 51 and switches 52–54. The capacitor 50 corresponds to the MOS capacitor 28, and the capacitor 51 corresponds to the MOS capacitor 29. The switch 52 corresponds to the nMOS transistors 32 and 33, and the switch 53 corresponds to the nMOS transistor 34. The switch 54 corresponds to the nMOS transistor 35.

A state of the circuit will be assumed in which the switches 52 and 53 are respectively ON and OFF, and the switch 54 is ON. Further, the oscillation signal OSC is at the ground voltage VSS, and the oscillation signal $\overline{OSC}$ is at the power supply voltage VCC. From the above state, the switches 52, 53 and 54 are respectively turned OFF, ON and OFF, and the oscillation signals OSC and $\overline{OSC}$ are respectively switched to the power supply voltage VCC and the ground voltage VSS.

When the oscillation signal OSC increases from the ground voltage VSS to the power supply voltage VCC, the charge Q1 is supplied from the oscillation circuit 41 to the capacitor 50, and the charge Q2 of the same amount as the charge Q1 is supplied from the capacitor 50 to the capacitor 51 via the switch 53. When the oscillation signal $\overline{OSC}$ decreases from the power supply voltage VCC to the ground voltage VSS, a charge Q5 of the same amount as the charge Q2 is drawn from the capacitor 51 to the oscillation circuit 41.

The switches 52, 53 and 54 are respectively turned ON, OFF and ON, and simultaneously the oscillation signals OSC and $\overline{OSC}$ respectively switch to the ground voltage VSS and the power supply voltage VCC. When the oscillation signal OSC decreases from the power supply voltage VCC to the ground voltage VSS, the charge Q3 of the same amount as the charge Q1 is drawn from the capacitor 50 to the oscillation circuit 41. Further, the charge Q4 of the same amount as the charge Q3 is supplied from the VCC power supply to the capacitor 50 via the switch 52. When the oscillation signal $\overline{OSC}$ increases from the ground voltage VSS to the power supply voltage VCC, a charge Q6 of the same amount as the charge Q5 is supplied to the capacitor 51, and a charge Q7 of the same amount as the charge Q6 is supplied from the capacitor 51 to the load capacitance 49 via the switch 54. Then, the same operation as described above is repeatedly carried out.

Hence, the maximum efficiency $\Gamma$ of the boost circuit 18 is as follows:

$$\Gamma = (\text{current supplied to the load capacitance 49})/(\text{current consumed in circuit 48}) \times 100$$
$$= [Q7/(Q1+Q5+Q4)] \times 100.$$

Since Q1=Q4=Q5=Q7, the maximum efficiency $\Gamma$ of the boost circuit 18 is:

$$\Gamma=(\tfrac{1}{3})\times 100=33\,[\%].$$

The boost circuit 17 has one stage of stepping up the power supply voltage VCC, and the boost circuit 18 has two stages of stepping up the power supply voltage VCC. Generally, when there are N boost stages, the stepping-up operation is performed through N capacitors. Hence, the maximum efficiency is equal to $[1/(N+1)]\times 100[\%]$.

In the embodiment of the present invention, the boost circuit 17 supplies the BRS generating circuit 14 with the boosted voltage $SVCC_L$ (=VCC/2+VTH+α). The maximum efficiency of the boost circuit 17 is 50 [%]. Hence, it is enough for the boost circuit 17 to consume a current $2I_{BRS}$ where $I_{BRS}$ denotes current to be supplied to the BRS generating circuit 14 from the boost circuit 17.

If the boost circuit 18 was to supply the BRS generating circuit 14 with the boosted voltage $SVCC_H$ (=VCC+VTH+α), the boost circuit 18 would consume $3I_{BRS}$ in order to supply the BRS generating circuit 14 with the current $I_{BRS}$ because the maximum efficiency of the boost circuit 18 is 33[%].

In short, according to the embodiment of the present invention, there are provided the boost circuit 17 which has a maximum efficiency of 50[%] and generates the boosted voltage $SVCC_L$ (=VCC/2+VTH+α), and the boost circuit 18 which has a maximum efficiency of 33[%] and generates the boosted voltage $SVCC_H$ (=VCC+VTH+α). The BRS generating circuit 14 is supplied with the boosted voltage $SVCC_L$ (=VCC/2+VTH+α) from the boost circuit 17, and the BLT generating circuit 15 is supplied with the boosted voltage $SVCC_H$ (=VCC+VTH+α) from the boost circuit 18. Hence, it is possible to reduce current consumed in the boost circuits and reduce consumption energy of the memory device.

Figure 6:
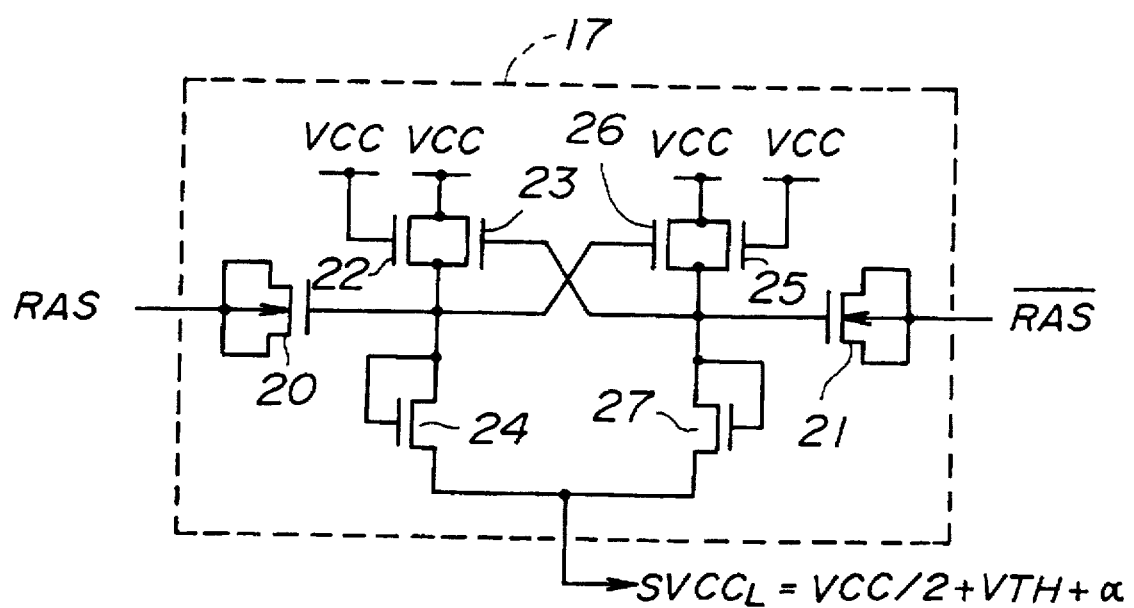
FIG. 6 is a circuit diagram of the boost circuit 17 shown in FIG. 3A.

Instead of the oscillation signals OSC and $\overline{OSC}$, as shown in FIG. 6, a row address strobe signal $\overline{RAS}$ supplied from an external device and its inverted version RAS can be supplied, as driving signals, to the boost circuit. In this case, it is possible to further reduce the current consumed in the boost circuit 17.

Alternatively, it is possible to provide a single boost circuit capable of generating the boosted voltage $SVCC_H$ (=VCC+VTH+α) and the boosted voltage $SVCC_L$ (=VCC/2+VTH+α).

Figure 7:
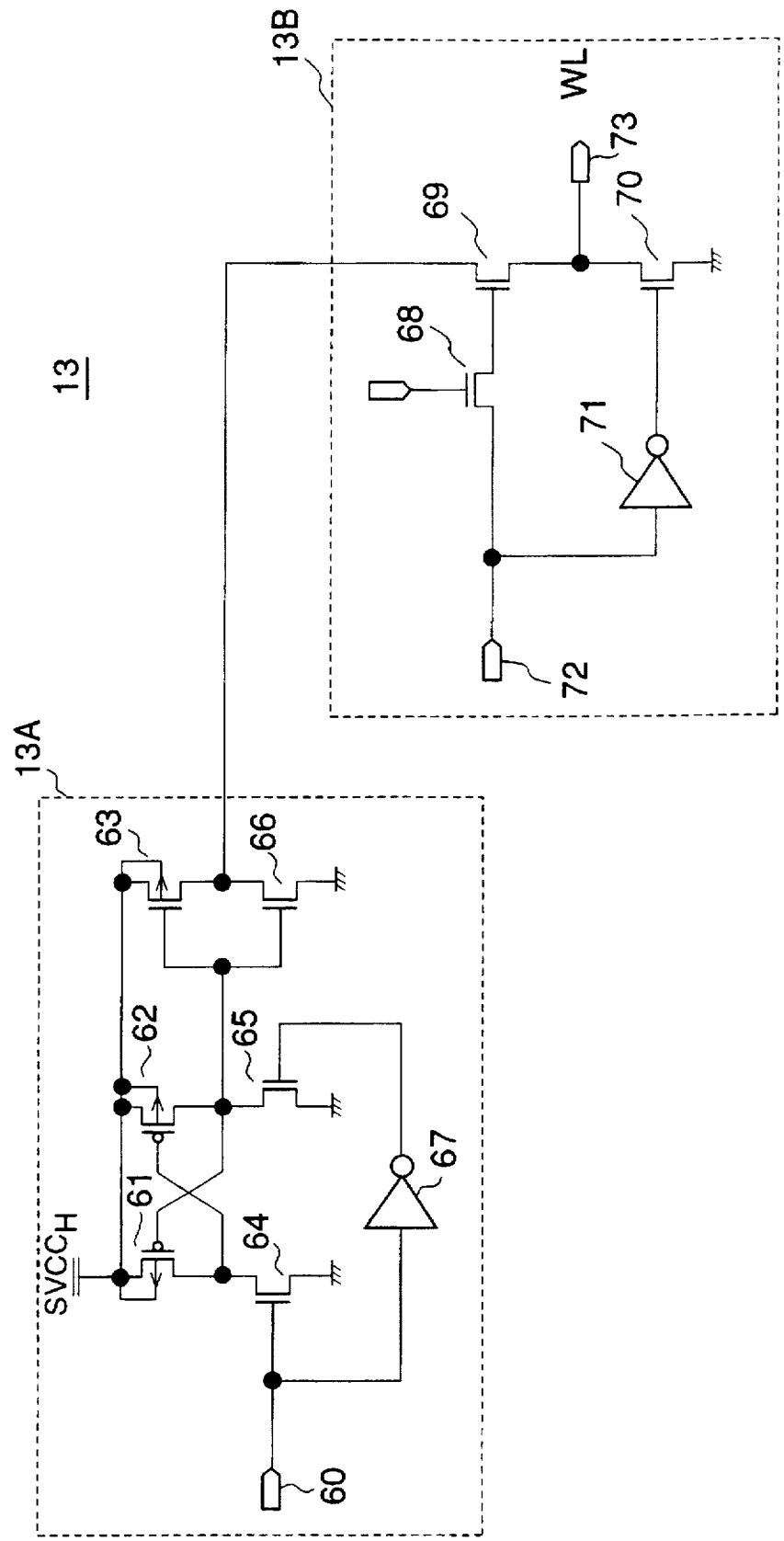
FIG. 7 is a circuit diagram of a row decoder shown in FIG. 2.

FIG. 7 is a circuit diagram of the row decoder 13 shown in FIG. 2. The row decoder 13 is formed by a first decoder part 13A and a second decoder part 13B. The first decoder part 13A is made up of pMOS transistors 61, 62 and 63, nMOS transistors 64, 65 and 66, and an inverter 67. The second decoder part 13B is made up of nMOS transistors 68, 69 and 70, and an inverter 71. A first predecoded signal obtained in a conventional manner is applied to a terminal 60 of the first decoder part 13A. When the first predecoded signal is at a low level, the nMOS transistor 65 is ON. Hence, the pMOS transistor 63 is ON and the nMOS transistor 66 is OFF. Thus, the boosted voltage $SVCC_H$ is applied to the drain of the nMOS transistor 69 of the second decoder part 13B. When a second predecoded signal obtained in the conventional manner applied to a terminal 72 is high, the above signal is applied to the gate of the nMOS transistor 69 through the boot strap transistor 68 receiving a predetermined gate voltage. In this case, the nMOS transistor 69 is ON, and the boosted voltage $SVCC_H$ is applied to the corresponding word line WL through a terminal 73. As has been described previously, the boosted voltage $SVCC_H$ is equal to VCC+VTH+α. Hence, the word line driving voltage nearly equal to VCC can be applied to the selected word line WL.

Figure 8:
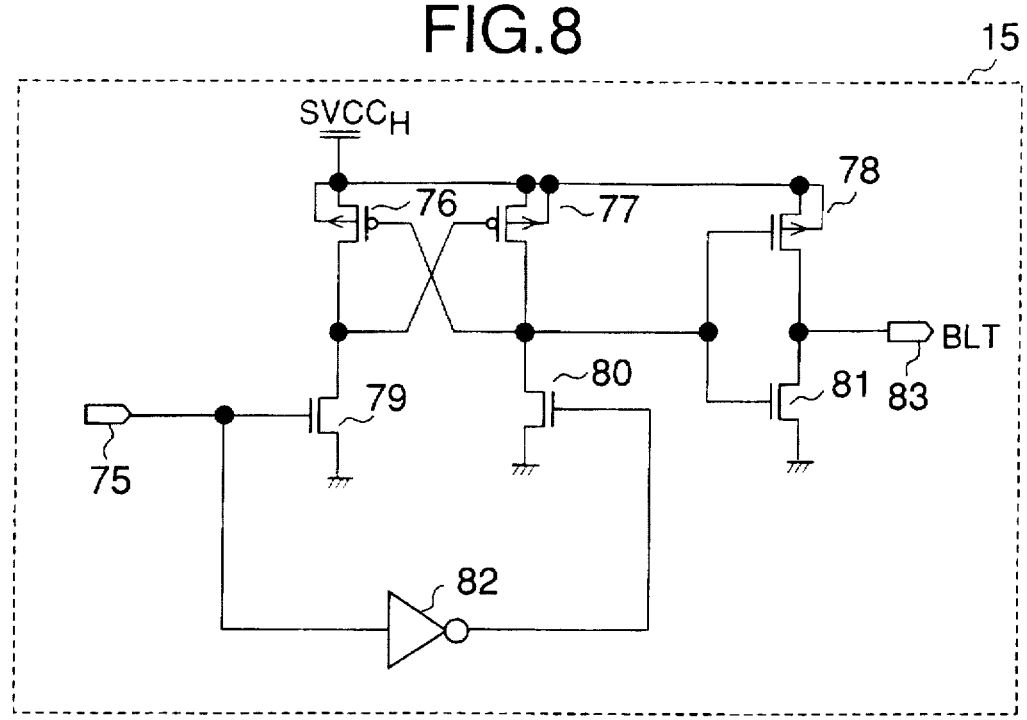
FIG. 8 is a circuit diagram of a BRS generating circuit shown in FIG. 2.

FIG. 8 is a circuit diagram of the BLT generating circuit 15 shown in FIG. 2. This circuit is made up of pMOS transistors 76, 77 and 78, nMOS transistors 79, 80 and 81, and an inverter 82. A column-decoded signal obtained in a conventional manner is applied to a terminal 75 of the circuit 15. When the column-decoded signal is low, the nMOS transistor 80 is ON. Hence, the pMOS transistor 78 is ON and the nMOS transistor 81 is OFF. Hence, the boosted voltage $SVCC_H$ is applied, through the pMOS transistor 78 and a terminal 83, to the gates of the nMOS transistors 10 and 11 of the bit line transfer circuit 9 shown in FIG. 2. As has been described previously, the boosted voltage $SVCC_H$ is equal to VCC+VTH+α. Hence, the driving signal BLT nearly equal to VCC can be applied to the bit line transfer circuit 9 shown in FIG. 2.

Figure 9:
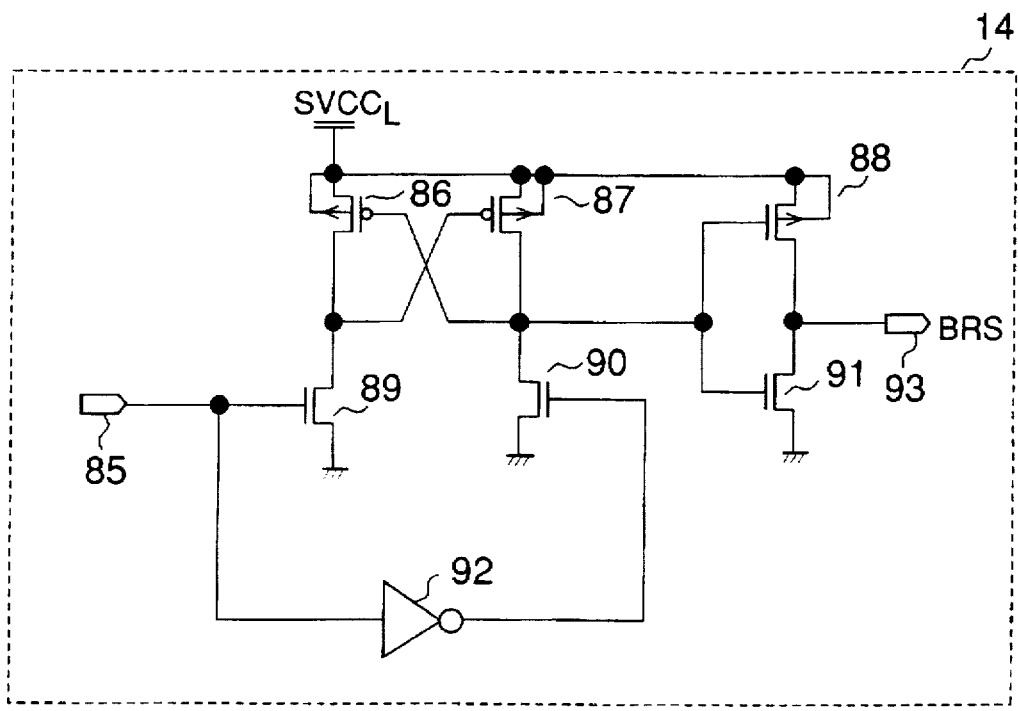
FIG. 9 is a circuit diagram of a BLT generating circuit shown in FIG. 2.

FIG. 9 is a circuit diagram of the BRS generating circuit 14 shown in FIG. 2. The circuit 14 is made up of pMOS transistors 86, 87 and 88, nMOS transistors 89, 90 and 91, and an inverter 92. A decoded signal obtained in a conventional manner is applied to a terminal 85 of the circuit 14. When the decoded signal is low, the nMOS transistor 90 is ON. Hence, the pMOS transistor 88 is ON and the nMOS transistor 91 is OFF. Thus, the boosted voltage $SVCC_L$ is applied, through the pMOS transistor 88 and a terminal 93, to the gates of the nMOS transistors 5, 6 and 7 of the bit line resetting/short-circuiting circuit 4 shown in FIG. 2. As has been described previously, the boosted voltage $SVCC_L$ is equal to VCC/2+VTH+α. Hence, the driving signal BRS nearly equal to VCC/2 can be applied to the bit line resetting/short-circuiting circuit 4 shown in FIG. 2.

According to the present invention, there is provided means for producing boosted voltages from the power supply voltage, so that internal circuits of the memory device can be supplied with respective, suitable boosted voltages and consume a smaller amount of energy.

Further, the present invention includes another memory device such as a flash memory device.

The present invention is not limited to the specifically disclosed embodiments, and variations and modifications may be made without departing from the scope of the present invention.

What is claimed is:

1. A semiconductor memory device comprising:
   pairs of bit lines;
   first circuits which are respectively coupled to the pairs of bit lines and which precharge the pairs of bit lines and precharge the pairs of bit lines in accordance with a first control signal;
   sense amplifiers respectively coupled to the pairs of bit lines;
   second circuits which are respectively provided between the pairs of bit lines and the sense amplifiers and selectively connect the pairs of bit lines to the sense amplifiers in response to a second control signal;
   a third circuit which produces first and second boosted voltages from a power supply voltage and supplies the first and second boosted voltages to the first and second circuits respectively, wherein the first control signal is produced from the first boosted voltage and the second control signal is produced from the second boosted voltage,
   the first boosted voltage being lower than the second boosted voltage; and
   wherein the second control signal is applied to word lines in order to drive the word lines.

2. The semiconductor memory device as claimed in claim 1, wherein the third circuit comprises a first circuit section which derives the first boosted voltage from the power supply voltage, and a second circuit section which derives the second boosted voltage from the power supply voltage.

3. The semiconductor memory device as claimed in claim 2, wherein said first circuit section comprises:
   a first switch element having a first end receiving the power supply voltage, and a second end;
   a second switch element having a first end connected to the second end of the first switch element and a second end via which the first boosted voltage is output; and
   a capacitor having a first end connected to the second end of the first switch element and a second end receiving a driving signal.

4. The semiconductor memory device as claimed in claim 2, wherein the second circuit section comprises:
   a first switch element having a first end receiving the power supply voltage and a second end;
   a second switch element having a first end connected to the second end of the first switch element and a second end;

a third switch element having a first end connected to the second end of the second switch element and a second end via which the second boosted voltage is output;

a first capacitor having a first end connected to the second end of the first switch element and a second end receiving a first driving signal; and a second capacitor having a first end connected to the second end of the second switch element and a second end receiving a second driving signal having a complementary relationship with the first driving signal.

5. The semiconductor memory device as claimed in claim 2, wherein said first circuit section comprises:

a first switch element having a first end receiving the power supply voltage, and a second end;

a second switch element having a first end connected to the second end of the first switch element and a second end via which the first boosted voltage is output; and a first capacitor having a first end connected to the second end of the first switch element and a second end receiving a first driving signal, and wherein the second circuit section comprises:

a third switch element having a first end receiving the power supply voltage and a second end;

a fourth switch element having a first end connected to the second end of the third switch element and a second end;

a fifth switch element having a first end connected to the second end of the fourth switch element and a second end via which the second boosted voltage is output;

a second capacitor having a first end connected to the second end of the third switch element and a second end receiving a second driving signal; and a third capacitor having a first end connected to the second end of the fourth switch element and a second end receiving a third driving signal having a complementary relationship with the second driving signal.

6. The semiconductor memory device as claimed in claim 5, wherein the first driving signal is the same as the second driving signal.

7. The semiconductor memory device as claimed in claim 5, further comprising an oscillation circuit generating the second and third driving signals.

8. The semiconductor memory device as claimed in claim 5, further comprising an oscillation circuit generating the second and third driving signals, wherein the first driving signal is based on a row address strobe signal externally applied to the semiconductor memory device.

9. A semiconductor memory device comprising a boost circuit that produces boosted voltages from a power supply voltage, said boosted voltages having different voltage values, wherein said boost circuit includes a plurality of boost circuits, wherein the plurality of boost circuits includes a first boost circuit that produces a first boosted voltage to be supplied to word lines for selecting memory cells and circuits which connect bit lines serving as data transfer paths to sense amplifiers, and a second boost circuit that produces a second boosted voltage to be supplied to a circuit which precharges the bit lines, wherein the second boosted voltage is lower than the first boosted voltage, wherein the first boost circuit includes:

a first switch element having a first end supplied to the power supply voltage, and a second end;

a second switch element having a first end connected to the second end of the first switch element, and a second end;

a third switch element having a first end connected to the second end of the second switch element, and a second end via which the first boosted voltage is output;

a first capacitor having a first end connected between the first and second switch elements, and a second end supplied with a first driving signal; and a second capacitor having a first end connected between the second and third switch elements, and a second end supplied with a second driving signal which corresponds to an inverted version of the first driving signal, and wherein said second boost circuit includes:

a fourth switch element having a first end supplied with the power supply voltage, and a second end;

a fifth switch element having a first end connected to the second end of the fourth switch element, and a second end via which the second boosted voltage is output; and a third capacitor having a first end connected between the fourth and fifth switch elements, and a second end supplied with a third driving signal.

10. The semiconductor memory device as claimed in claim 9, wherein:

the first and second driving signals are signals generated in the semiconductor memory device; and the third driving signal is based on a row address strobe signal supplied from an outside of the semiconductor memory device.

11. A semiconductor memory device comprising:

pairs of bit lines;

word lines;

first circuits which are respectively coupled to the pairs of the bit lines and precharge the pairs of bit lines in accordance with a first control signal;

sense amplifiers respectively coupled to the pair of bit lines;

a second circuit which selectively drives the word lines by a second control signal; and a third circuit which produces first and second boosted voltages from a power supply voltage and supplies the first and second boosted voltages to the first and second circuits, respectively, wherein the first control signal is produced from the first boosted voltage and the second control signal is produced from the second boosted voltage, wherein the first boosted voltage is lower than the second boosted voltage.

12. The semiconductor memory device as claimed in claim 11, wherein the third circuit includes a first circuit sections which derives the first boosted voltage from the power supply voltage, and a second circuit section which derives the second boosted voltage from the power supply voltage.

13. The semiconductor memory device as claimed in claim 12, wherein said first circuit section includes:

a first switch element having a first end receiving the power supply voltage, and a second end;

a second switch element having a first end connected to the second end of the first switch element and a second end via which the first boosted voltage is output; and a capacitor having a first and connected to the second end of the first switch element and a second end receiving a driving signal.

14. The semiconductor memory device as claimed in claim 12, wherein the second circuit section includes:
   a first switch element having a first end receiving the power supply voltage and a second end;
   a second switch element having a first end connected to the second end of the first switch element and a second end;
   a third switch element having a first end connected to the second end of the second switch element and a second end via which the second boosted voltage is output;
   a first capacitor having a first end connected to the second end of the first switch element and a second end receiving a first driving signal; and
   a second capacitor having a first end connected to the second end of the second switch element and a second end receiving a second driving signal having a complementary relationship with the first driving signal.

15. The semiconductor memory device as claimed in claim 12, wherein said first circuit section includes:
   a first switch element having a first end receiving the power supply voltage, and a second end;
   a second switch element having a first end connected to the second end of the first switch element and a second end via which the first boosted voltage is output; and
   a first capacitor having a first end connected to the second end of the first switch element and a second end receiving a first driving signal, and
   wherein the second circuit section includes:
   a third switch element having a first end receiving the power supply voltage and a second end;
   a fourth switch element having a first end connected to the second end of the fourth switch element and a second end via which the second boosted voltage is output;
   a second capacitor having a first end connected to the second end of the third switch element and a second end receiving a second driving signal; and
   a third capacitor having a first end connected to the second end of the fourth switch element and a second end receiving a third driving signal having a complementary relationship with the second driving signal.

16. The semiconductor memory device as claimed in claim 15, wherein the first driving signal is the same as the second driving signal.

17. The semiconductor memory device as claimed in claim 15, further comprising an oscillation circuit generating the second and third driving signals.

18. The semiconductor memory device as claimed in claim 15, further comprising an oscillation circuit generating the second and third driving signals,
   wherein the first driving signal is based on a row address strobe signal externally applied to the semiconductor memory device.

19. A semiconductor memory device comprising:
   a precharge circuit;
   a transfer circuit;
   at least two different boosting circuits respectively coupled to the precharge circuit and the transfer circuit so as to apply different voltages to the precharge circuit and the transfer circuit.

* * * * *

UNITED STATES PATENT AND TRADEMARK OFFICE
CERTIFICATE OF CORRECTION

PATENT NO.: 5,703,814
DATED : December 30, 1997
INVENTOR(S): Koichi NISHIMURA et al.

It is certified that error appears in the above-identified patent and that said Letters Patent is hereby corrected as shown below:

Col. 1, line 23, change "$WL_N$" to --$WL_n$--.

Col. 5, line 48, change "since" to --Since--.

Col. 6, line 4, change "OSC" to -- $\overline{OSC}$ --;

line 22, change "OSC" (second occurrence) to -- $\overline{OSC}$ --;

line 30, change "OSC" to -- $\overline{OSC}$ --.

Col. 10, line 57, change "sections" to --section--.

Col. 11, line 1, change "and" to --end--.

Signed and Sealed this

Sixteenth Day of February, 1999

Attest:

*Acting Commissioner of Patents and Trademarks*

*Attesting Officer*